(12) United States Patent  
Yamazaki

(10) Patent No.: US 6,545,458 B2
(45) Date of Patent: Apr. 8, 2003

(54) LOW-TEMPERATURE TEST EQUIPMENT

(75) Inventor: Hiroshi Yamazaki, Tokyo (JP)

(73) Assignee: Nagase Sangyo Kabushiki Kaisha, Osaki (JP)

( * ) Notice: Subject to any disclaimer, the term of this patent is extended or adjusted under 35 U.S.C. 154(b) by 0 days.

(21) Appl. No.: 09/823,795

(22) Filed: Mar. 30, 2001

(65) Prior Publication Data

US 2002/0011835 A1 Jan. 31, 2002

(30) Foreign Application Priority Data

Mar. 30, 2000 (JP) ........................................ 2000-094088

(51) Int. Cl.[7] ............................................... G01R 31/02
(52) U.S. Cl. ..................... 324/158.1; 324/758; 324/760
(58) Field of Search ............................... 324/756–758, 324/754, 755, 765, 158.1, 760; 356/399, 400, 401; 348/126, 130

(56) References Cited

U.S. PATENT DOCUMENTS 5,394,100 A * 2/1995 Bohler et al. ............... 324/757
5,416,592 A * 5/1995 Mori et al. .................. 250/548
5,521,522 A * 5/1996 Abe et al. .................... 324/754
5,644,245 A * 7/1997 Saitoh et al. ................ 324/754
6,140,828 A * 10/2000 Iino et al. .................... 324/758

* cited by examiner

*Primary Examiner*—Kamand Cuneo
*Assistant Examiner*—Minh N. Tang
(74) *Attorney, Agent, or Firm*—Steinberg & Raskin, P.C.

(57) ABSTRACT

A low-temperature test equipment capable of monitoring a test under vacuum and low temperature or ultra-low temperature conditions. The test equipment includes plural CCD cameras so arranged that plane positions thereof are rendered different from each other, as well as a prism mechanism constructed and arranged so as to permit any of the cameras to photograph a surface of a semiconductor wafer and/or a range of at least a part of probe needles of a prober. This permits a test for the wafer by the prober under vacuum and low temperature or ultra-low temperature conditions to be monitored. Also, it facilitates positional registration between the probe needles and the wafer and ensures an increase in accuracy of the test. In addition, when the low-temperature test equipment is configured so as to carry out the test in a continuous manner, full automation of the test may be realized.

5 Claims, 3 Drawing Sheets

LOW-TEMPERATURE TEST EQUIPMENT

BACKGROUND OF THE INVENTION

This invention relates to a low-temperature test equipment for testing or measuring electric characteristics of a specimen cooled in a vacuum atmosphere and the like, and more particularly to a low-temperature test equipment suitable for use as a semiconductor wafer test equipment for testing a semiconductor wafer.

In recent years, it has been highly demanded that a semiconductor device is subjected to measurement of electric characteristics thereof at an ultra-low temperature in a vacuum atmosphere for the purpose of ensuring reliable screening due to detection of abnormal leakage current which fails to be detected in a room temperature, checking of a low-temperature operation device such as a high-precision photo detector, measurement of physical characteristics of a device or pure wafer element at a low temperature to measure various characteristics thereof such as a concentration of impurities therein, and the like.

For this purpose, a test equipment is proposed in the art which includes a vacuum chamber formed so as to be evacuated at a vacuum by means of a vacuum pump, a wafer holder arranged in the vacuum chamber, an ultra-low temperature refrigerator having a cooling head positioned in the vacuum chamber, and the like. Also, another test equipment is known in the art, as disclosed in Japanese Patent Application Laid-Open Publication No. 137547/1992. The test equipment includes a vacuum chamber, a spare chamber arranged adjacently to the vacuum chamber and configured so as to communicate through a gate valve to the vacuum chamber and temporarily store a wafer which is an object to be tested (tested object) therein. The test equipment is so constructed that the spare chamber is evacuated at a vacuum when the wafer is accessed to the vacuum chamber and the gate valve is closed to increase a pressure in only the spare chamber to an atmospheric level when the wafer is removed from the spare chamber. This ensures that the vacuum chamber is constantly kept at a vacuum, to thereby subject the semiconductor wafer to a continuous test under ultra-low temperature conditions.

A test equipment for carrying out such a test at a normal temperature is generally constructed so as to monitor a procedure or situation of the test by means of a CCD camera, to thereby analyze an image of a surface of a semiconductor wafer and confirm a contact position of a distal end of a probe needle or a position at which the distal end is contacted with the semiconductor wafer. The CCD camera is required to provide an image at a high magnification and a narrow visual field in order to ensure that the contact position of the distal end of the probe needle is effectively confirmed, whereas it is required to provide an image at a low magnification and a wide visual field in order to ensure that an image of the surface of the semiconductor wafer is satisfactorily analyzed. Also, image-pickup or photographing by the CCD must be carried out through a hole of a probe card. Thus, the single CCD camera which includes a zoom lens has been conventionally used for this purpose.

However, in the above-described conventional test equipment at a low or ultra-low temperature, arrangement of the CCD camera including the zoom lens arranged in the vacuum chamber causes bursting of a lens receiving vessel, leading to production of gas from a motor for zooming, so that arrangement of the CCD camera in the vacuum chamber is rendered impossible.

Also, there are proposed techniques wherein two cameras are used in such a manner that one of the cameras is arranged above a hole of a probe card to analyze an image of a surface of a semiconductor wafer and the other camera is placed on a wafer holder to pick up an image of a probe needle from below. However, application of the techniques to the test equipment operated at a low or ultra-low temperature while setting the cameras on the wafer holder causes heat generated from the cameras to be transmitted to the wafer holder being cooled, to thereby adversely affect reliability of results of the test. Also, the wafer holder is cooled due to direct transmission of heat of the refrigerator thereto, so that arrangement of the camera on the wafer holder adversely affects operation of the camera, so that employment of the above-described techniques is substantially impossible.

Thus, the conventional test equipment operated at a low or ultra-low temperature fails to monitor a procedure or situation of the test by means of a image-pickup or photographing device such as a CCD camera or the like, resulting in positional registration or alignment between the probe needle and the semiconductor wafer being high difficult or substantially impossible. In particular, such a test equipment constructed so as to carry out continuous test operation fails to control operation of aligning the probe needle and semiconductor wafer with each other in association with monitoring operation as described above, leading to a failure in complete automation of the test.

SUMMARY OF THE INVENTION

The present invention has been made in view of the foregoing disadvantage of the prior art.

Accordingly, it is an object of the present invention to provide a low-temperature test equipment which is capable of monitoring a test of a specimen by a prober under vacuum and low temperature or ultra-low temperature conditions.

It is another object of the present invention to provide a low-temperature test equipment which is capable of facilitating positional registration or alignment between probe needles and a specimen, to thereby ensure a test at high accuracy.

It is a further object of the present invention to provide a low-temperature test equipment which is capable of attaining full automation of a test when it is constructed so as to continuously carry out test operation.

It is still another object of the present invention to provide a low-temperature test equipment which is capable of being suitable for a test for a semiconductor wafer.

In accordance with the present invention, a low-temperature test equipment is provided. The low-temperature test equipment includes a vacuum chamber, a prober including a probe card and probe needles and arranged in the vacuum chamber, a specimen holder constructed to hold a specimen thereon and arranged in the vacuum chamber, a refrigerator having a cooling head arranged in the vacuum chamber, to thereby cool the specimen through the specimen holder prior to a test of the specimen by means of the prober, and a plurality of photographing means or image pickup means arranged above the specimen holder in the vacuum chamber in such a manner that plane positions thereof are different from each other. The photographing means are set at photographing magnifications different from each other, to thereby photograph a range of at least a part of at least one of the specimen which is an object to be photographed (photographed object) and the probe needles. The low-temperature test equipment further includes a prism mechanism arranged between the photographing means and the specimen holder to permit the photographing means different in plane position from each other to photograph the photographed object.

In a preferred embodiment of the present invention, the prism mechanism is arranged so as to permit image-pickup or photographing by each of the photographing means to be carried out through a hole of the probe card.

In a preferred embodiment of the present invention, the photographing means are set so as to permit one of the photographing means to photograph a distal end of the probe needles at a high magnification and a narrow visual field and the other photographing means to photograph a surface of the specimen at a low magnification and a wide visual field.

In a preferred embodiment of the present invention, the plural photographing means are arranged so as to be movable in three-dimensional directions.

In a preferred embodiment of the present invention, the photographing means each are constituted by a CCD camera.

In a preferred embodiment of the present invention, the low-temperature test equipment further includes a spare chamber connected through an openable gate valve to the vacuum chamber so that evacuation of the spare chamber at a vacuum and opening thereof to an atmosphere may be selectively carried out. The spare chamber is constructed so as to receive a plurality of the specimens therein and feed the specimens received therein to the specimen holder while constantly keeping the vacuum chamber at a vacuum, resulting in the specimen being tested successively.

In a preferred embodiment of the present invention, the specimen is a semiconductor wafer and the specimen holder is a wafer holder, whereby a semiconductor wafer supported on the wafer holder is subjected to a test.

BRIEF DESCRIPTION OF THE DRAWINGS

These and other objects and many of the attendant advantages of the present invention will be readily appreciated as the same becomes better understood by reference to the following detailed escription when considered in connection with the accompanying drawings; wherein.

DETAILED DESCRIPTION OF THE PREFERRED EMBODIMENT

Now, a low-temperature test equipment according to the present invention will be described hereinafter with reference to the accompanying drawings.

Figure 1:
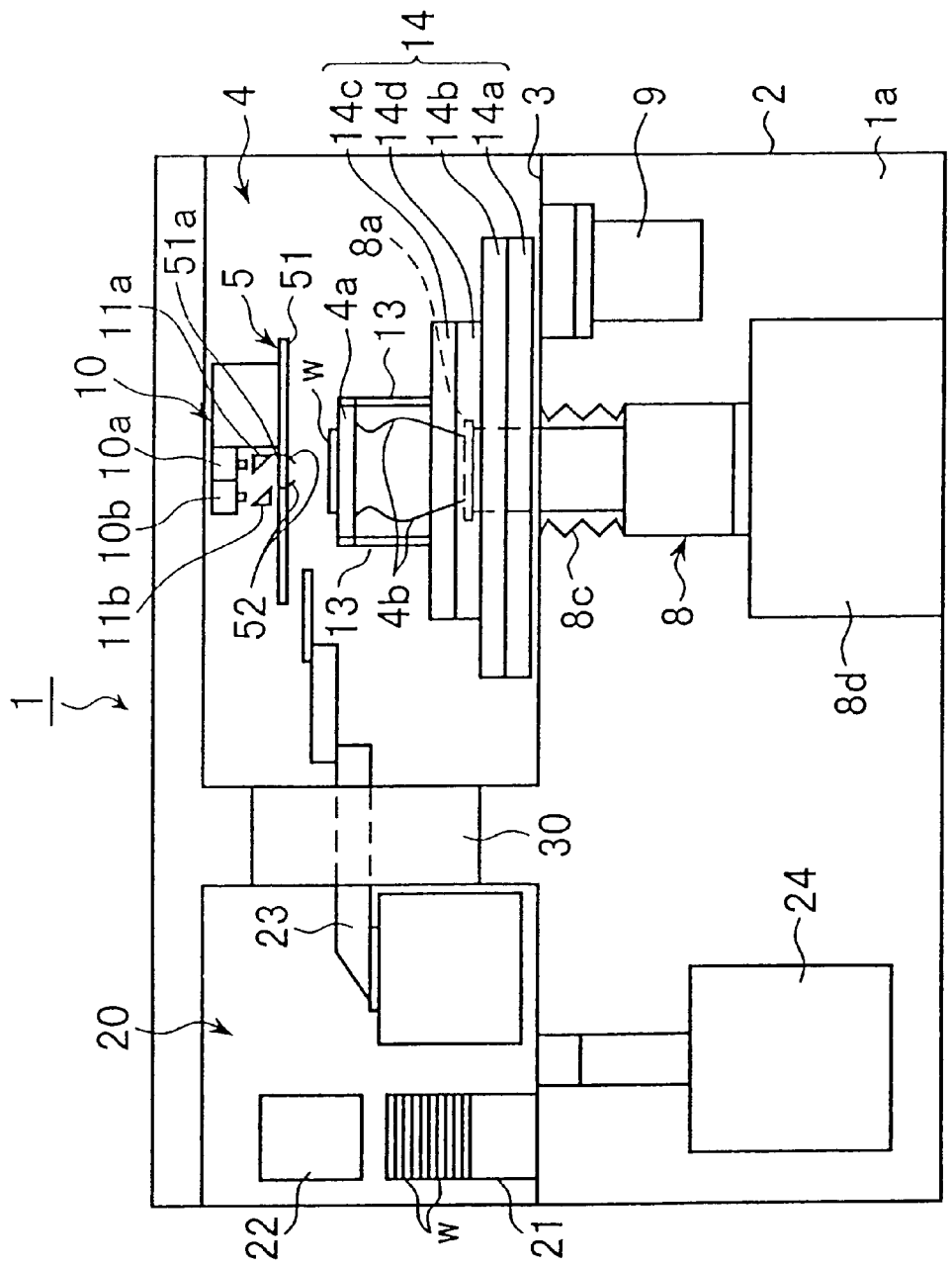
FIG. 1 is a schematic view generally showing an embodiment of a low-temperature test equipment according to the present invention which is practiced in the form of a semiconductor wafer test equipment.

Referring first to FIG. 1, an embodiment of a low-temperature test equipment according to the present invention is illustrated, which is embodied in the form of a semiconductor wafer test equipment. A low-temperature test equipment or semiconductor wafer test equipment of the illustrated embodiment generally designated at reference numeral 1 includes a support frame 2 which is provided therein with an upper plate 3. Arrangement of the upper plate 3 in the support frame 2 permits a space 1a acting as a machine room to be defined below the upper plate 3 in the support frame 2. The test equipment 1 also includes a vacuum chamber 4 supported on the upper plate 3 in the support frame 2, a wafer holder 4a arranged in the vacuum chamber 4, a test prober 5 having a probe card 51 and probe needles 52 inserted into the vacuum chamber 4, a refrigerator 8 and a turbo pump 9 acting as a vacuum pump each arranged in the machine room 1a, an image-pickup or photographing unit 10, and a spare chamber 20 arranged in the support frame 2.

In the semiconductor wafer test equipment 1 thus generally constructed, the refrigerator 8 is provided at a top end thereof with a cooling head 8a and arranged in a manner to extend through a mounting hole formed via the upper plate 3 into the vacuum chamber 4 so that the cooling head 8a is positioned in the vacuum chamber 4. The wafer holder 4a is arranged so as to enable a specimen or semiconductor wafer W which is an object to be tested (tested object) to be held thereon. The cooling head 8a and wafer holder 4a are connected through heat transfer mediums 4b to each other.

More specifically, the vacuum chamber 4 is configured into a box-like shape and constructed in an airtight manner. The vacuum chamber 4 is evacuated at a predetermined pressure or vacuum by actuation of the turbo pump 9. Also, the vacuum chamber 4 is provided on one of side walls thereof with an openable gate valve 30 which permits the semiconductor wafer W to be selectively accessed to the vacuum chamber therethrough.

The refrigerator 8 includes a compressor and the like in addition to the cooling head 8a and may be constructed in a manner to be conventionally known in the art so long as it permits the vacuum chamber 4 to be cooled to a low temperature or an ultra-low temperature. For example, a refrigerator using helium, liquid nitrogen, alternate flon or the like as a refrigerant may be used for this purpose. Between the refrigerator 8 and the upper frame 3 is arranged a bellows 8c in a manner to be connected therebetween, so that it may absorb vibration of the refrigerator 8. Below the refrigerator 8 is positioned a weight member 8d in a manner to be integrally connected thereto. The weight member 8d acts to hold the refrigerator 8 as immovable as possible, resulting in functioning as a vibration restraining means.

The wafer holder 4a arranged above the cooling head 8a in the vacuum chamber 4 is made of, for example, a copper plate and supported on four rods 13. The rods 13 each are arranged on a transfer stage structure 14 constructed so as to be movable in three-dimensional directions. More specifically, the transfer stage structure 14 includes an X-stage 14a movable in a longitudinal direction, a Y-stage 14b movable in a lateral direction and a Z-stage 14c movable in a vertical direction. The transfer stage structure 14 further includes a e-stage 14d for rotatably supporting the Z-stage 14c. Operation of the stages permits the wafer holder 4b to be transferred in the vertical, lateral and longitudinal directions. The rods 13 each may be constituted by a tube made of a material such as, for example, ceramic, stainless steel or the like in order to minimize or substantially restrain transmission of heat generated from the transfer stage structure 14 to the wafer holder 4a.

The wafer holder 4a, as described above, is connected to the cooling head 8a through the heat transfer mediums 4b. The heat transfer mediums 4b each may be made of, for example, a copper wire or constituted by a so-called copper twisted member formed by twisting a plurality of copper wires together. Alternatively, the mediums 4b each may be constituted by a net member such as a copper net member formed of copper wires or the like. The heat transfer mediums 4b thus constructed function to transmit heat from the cooling head 8a therethrough to the wafer holder 4a. Formation of copper wires or the like into the heat transfer mediums 4b permits them to absorb vibration of the refrigerator 8 together with the bellows 14.

Figure 2:
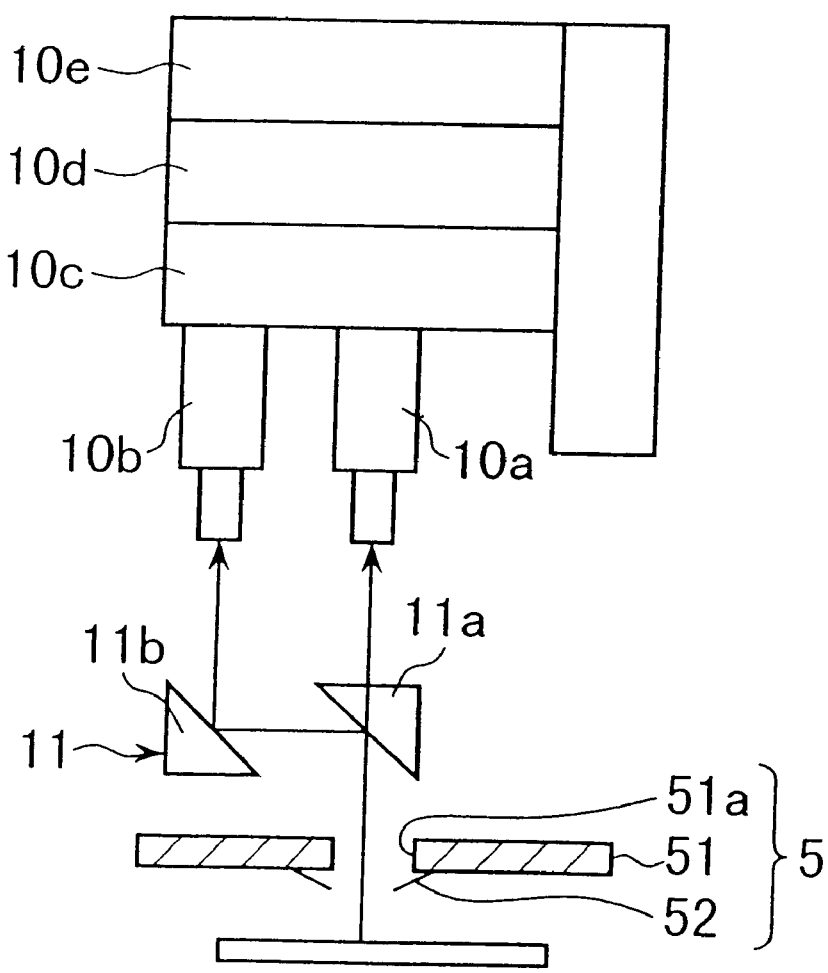
FIG. 2 is a schematic view showing image-pickup or photographing means and a prism mechanism which are incorporated in the semiconductor wafer test equipment shown in FIG. 1.

The prober 5, as shown in FIGS. 1 and 2, includes the probe card 51 of a ring-like shape formed at a central portion thereof with a hole 51a, to thereby provide an inner edge of the probe card 51. Also, the prober 5 includes a plurality of the above-described probe needles 52 each arranged so that a distal end thereof projects into the hole 51a. The probe card 51 may be supported on an actuation mechanism including a transfer stage movable in the X-Y-Z directions (longitudinal, lateral and vertical directions) and θ direction and an arm mounted on the transfer stage as required, so that adjustment of the actuation mechanism may lead to positional adjustment between the probe needles 52 and electrodes or the like formed on the semiconductor wafer W.

The image-pickup or photographing unit 10, as shown in FIGS. 1 and 2, is constituted by two CCD cameras 10a and 10b each acting as an image-pickup or photographing means. The CCD cameras 10a and 10b are operated in a vacuum atmosphere, to thereby be free from use of any zoom mechanism or eliminate arrangement of a zoom mechanism for each of the cameras, resulting in both magnification and visual field thereof being fixed. In this instance, as described below, the CCD cameras 10a and 10b each are constructed so as to pick up an image of the semiconductor wafer W and/or probe needles 52 which is an object be photographed (photographed object) through the hole 51a of the probe card 51 by means of a prism mechanism 11. Thus, when the CCD cameras 10a and 10b are set at the same magnification and visual field, images picked up by the cameras 10a and 10b are caused to be substantially identical with each other, so that arrangement of two CCD cameras 10a and 10b might be meaningless. Thus, in the illustrated embodiment, it is preferable that the CCD cameras 10a and 10b are properly directed to applications different from each other, for example, in such a manner that one camera 10a, which is constructed to be reduced in distance to the semiconductor wafer W, to thereby be suitable for enlargement, is used for confirmation of a distal end of the probe needles 52 or a contact position of the distal end with respect to the semiconductor wafer W and the other CCD camera 10b, which is increased in distance to the semiconductor wafer W, is used for analysis of an image of a surface of the semiconductor wafer W.

When the one CCD camera 10a is used for confirmation of the distal end of the probe 10b or a contact position thereof with respect to the semiconductor wafer W, it is set at a high magnification and a narrow visual field relatively to the other CCD camera 10b. Also, when the other CCD camera 10b is used for image-analysis of the surface of the semiconductor wafer W, it is set at a low magnification and a wide visual field as compared with the CCD camera 10a.

The CCD cameras 10a and 10b are arranged above the probe card 51 in the vacuum chamber 4. Also, the CCD cameras 10a and 10b each do not include any zoom mechanism as described above; thus, when the CCD cameras 10a and 10b are fixedly set at photographing or image-pickup conditions different from each other as described above, the CCD cameras 10a and 10b must be arranged so that plane positions thereof are kept different from each other. Further, photographing of a range of at least a part of at least one of the semiconductor wafer W and each of the probe needles 52 which are objects to be photographed is limited to photographing through the hole 51a of the probe card 51. Unfortunately, actually only one CCD camera can be arranged just above the hole 51a of the probe card 51.

In order to eliminate the above-described problem encountered when two such CCD cameras 10a and 10b are arranged, the low-temperature test equipment of the illustrated embodiment is so constructed that the prism mechanism 11 briefly described above is arranged between the CCD cameras 10a, 10b and the probe card 51. The prism mechanism 11 is configured so as to permit image-pickup by both CCD cameras 10a and 10b to be carried out through the hole 51a of the probe card 51.

In the illustrated embodiment, the prism mechanism 11, as shown in FIG. 2, is constituted by two prisms 11a and 11b. One prism 11a is arranged between the hole 51a of the probe card 51 and the one CCD camera 10a arranged at a position just above the hole 51a. The other prism 11b is positioned below the other CCD camera 10b.

Also, the one prism 11a is a so-called half prism, to thereby permit an image of the semiconductor wafer W and/or the probe needles 52 which is an object to be photographed (photographed object) to be received by the one CCD camera 10a arranged just above the one prism 11a. Also, the one prism 11a permits light constituting the image to be refracted thereby so that it may travel toward the other prism 11b spacedly positioned on a left side of the one prism 11a while being shifted by an angle of 90 degrees from the direction toward the one camera 10a in FIG. 2. The other prism 11b functions to permit the light refracted by the one prism 11a to be refracted thereby, resulting in it traveling in a direction upwardly shifted by 90 degrees and then being received by the other CCD camera 10b. The other prism 11b may be constituted by, for example, a rectangular prism. Arrangement of the prism mechanism 11 thus constructed is due to the reason that 90-degree refraction of light by the one prism 11a causes the light or image to be observed while being kept rotated by 180 degrees, therefore, it is required to further refract it by 90 degrees by the other prism 11b. Use of a half prism as the other prism 11b as well permits light for measurement to be incident thereon in a right-hand direction from a left-hand side in FIG. 2. The above-described arrangement of the prism structure 11 permits an image of the semiconductor wafer W and/or probe needles 52 to be captured by the two cameras 10a and 10b through the hole 51a of the probe card 51. Also, the CCD cameras 10a and 10b have photographing conditions set to be different from each other, respectively, so that the one CCD camera 10a may photograph an image of the surface of the semiconductor wafer W at high definition and the other CCD camera 10b picks up an image of the distal end of the probe needles 10b or a contact position thereof with respect to the semiconductor wafer W.

The CCD cameras 10a and 10b are supported on a transfer stage structure movable in three-dimensional directions which includes an X-stage 10c movable in a longitudinal direction, a Y-stage 10d movable in a lateral direction and a Z-stage 10e movable in a vertical direction, so that a position at which the CCD cameras 10a and 10b carry out photographing may be adjusted as desired.

The semiconductor wafer equipment 1 of the illustrated embodiment, as shown in FIG. 1, includes the spare chamber 20 arranged adjacently to the vacuum chamber 4 and connected through the gate valve 30 thereto. In the semiconductor wafer equipment 1 of the illustrated embodiment, the spare chamber 20 has a plurality of the tested objects or semiconductor wafers W received therein. The spare chamber 20 is constructed so as to communicate with an atmosphere during operation of receiving the semiconductor wafers therein and be kept at a vacuum during feeding of the semiconductor wafers W to the vacuum chamber 4, to thereby ensure that the semiconductor wafers W are successively subjected to a test intended.

More specifically, the spare chamber 20 is provided therein with a cassette stage 21 for holding the plural semiconductor wafers W thereon, a pre-alignment unit 22 and a robot arm 23.

The semiconductor wafers W held on the cassette stage 21 are transferred to the pre-alignment unit 22 one by one and aligned together thereon. Then, the gate valve 30 is rendered open and the robot arm 23 is extended into the vacuum chamber 4 to transfer the semiconductor wafer onto the wafer holder 4a. Also, the spare chamber 20 has a rotary pump 24 which acts as a vacuum pump connected thereto. Thus, when the gate valve 30 is open to carry out delivery of the semiconductor wafer W between the cassette stage 21 and the wafer holder 4a by means of the robot arm 23, the rotary pump 24 is activated to form a vacuum atmosphere in the spare chamber 20. This results in a vacuum being constantly kept in the vacuum chamber 4, to thereby ensure that the semiconductor wafers W may be successively subjected to an intended test.

Figure 3:
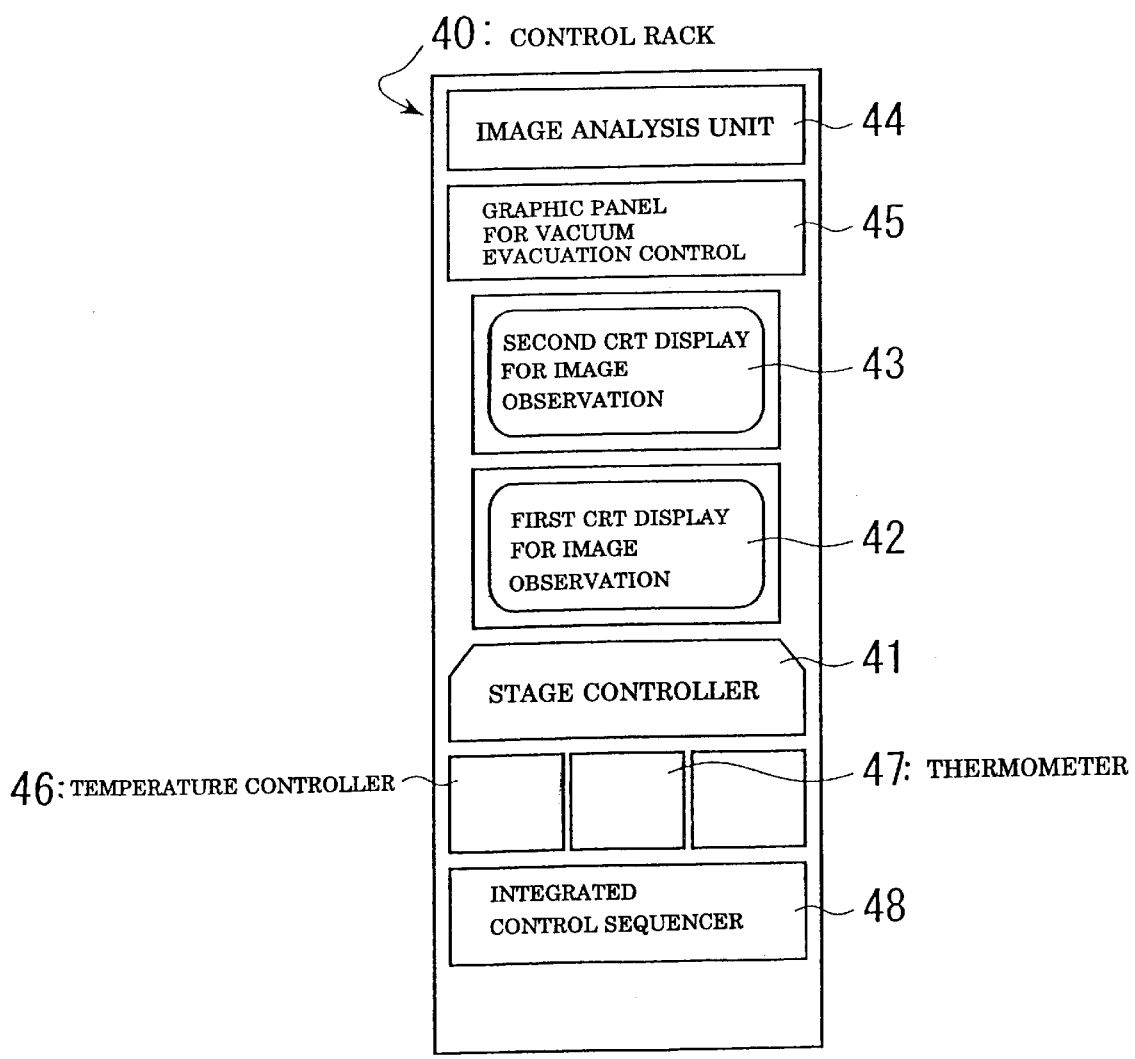
FIG. 3 is a block diagram schematically showing a control rack for controlling operation of the semiconductor wafer test equipment shown in FIG. 1.

Referring now to FIG. 3, a control rack in which a control section of the semiconductor wafer test equipment 1 of the illustrated embodiment and the like are arranged is illustrated. The control rack generally designated at reference numeral 40 includes a stage controller 41 for controlling each of the transfer stage structure 14 for the wafer holder 4a and the transfer stage structure provided on the image pickup unit 10, a CRT display 42 for image observation which functions to display an image picked up by the CCD camera 10a, a second CRT display 43 for image observation which functions to display an image picked up by the CCD camera 10b, an image analysis unit 44 for analyzing images picked up by the CCD cameras 10a and 10b, a graphic panel 45 for control of vacuum evacuation which functions to control actuation of the turbo pump 9 and rotary pimp 24, a temperature controller 46, a thermometer 47, and an integrated control sequencer 48 for integrally controlling the above-described components 41 to 47.

In the illustrated embodiment, when the semiconductor wafer W supported on the wafer holder 4a in the vacuum chamber 4 while being cooled is to be subjected to an intended test wherein the semiconductor wafer W is contacted with the probe needles 52 of the prober 5 for measurement of electrical characteristics thereof, images picked up by the CCD cameras 10a and 10b acting as the photographing means are displayed on the first CRT display 42 and second CRT display 43 for image observation required for both analysis of an image of the surface of the semiconductor wafer W and confirmation of a position of the distal end of the probe needles 52 or a contact position thereof with respect to the semiconductor wafer W, respectively. Thus, positional registration or alignment between the probe needles 52 and the semiconductor wafer W may be carried out by moving the transfer stage structure 14 for the wafer holder 4a while monitoring images displayed on the first and second CRT displays 42 and 43 for image observation, resulting in being highly increased in accuracy.

Also, the above-described arrangement of the prism mechanism 11 permits the CCD cameras 10a and 10b to carry out concurrent photographing operation through the hole 51a of the probe card 51 while rendering plane positions thereof different from each other. Thus, it will be noted that the low-temperature test equipment of the illustrated embodiment is suitable for a low temperature or ultra-low temperature test under vacuum conditions, unlike the conventional equipment including a zoom structure.

Further, the illustrated embodiment permits operation of aligning or positionally registering the probe needles 52 and semiconductor wafer W with each other to be carried out while being monitored on the CRT displays 42 and 43. Thus, the illustrated embodiment may be configured in such a manner that a result of the monitoring is subjected to arithmetic processing to generate an electric signal, which is fed to the stage controller 41 for controlling the transfer stage structure 14 for the wafer holder 4a, to thereby attain automatic control of the stages 14a to 14d of the transfer stage structure 14. Thus, the low-temperature test equipment of the illustrated embodiment which includes the spare chamber 20 constructed so as to successively feed the semiconductor wafers W to the vacuum chamber 4 realizes full automation of a test procedure under vacuum and low temperature or ultra-low temperature conditions.

The low-temperature test equipment of the present invention is not limited to the above-described construction. In the illustrated embodiment, the transfer stage mechanism for the CCD cameras 10a and 10b does not include a rotational stage rotated in a θ direction. However, of course it may include such a rotational stage. Also, the illustrated embodiment is provided with two CCD cameras. Alternatively, three or more such CCD cameras may be arranged. In this instance, it is required that arrangement of the prism mechanism 11 and the number of prisms therefor are adjusted to permit any of the CCD cameras to photograph a surface of the semiconductor wafer and/or a range of at least a part of the probe needles.

As can be seen from the foregoing, the low-temperature test equipment of the present invention is constructed so as to arrange the plural photographing or image-pickup means so that plane positions thereof are different from each other. Also, the equipment of the present invention includes the prism mechanism constructed and arranged so as to permit any of the photographing means to photograph a surface of a specimen such as a semiconductor wafer and/or a range of at least a part of the probe needles. Such configuration of the present invention permits a procedure or situation of any intended test for the specimen by means of the prober under vacuum and low temperature or ultra-low temperature conditions to be effectively monitored. Also, it facilitates positional registration between the probe needles and the specimen and ensures an increase in accuracy of the test. In addition, the present invention realizes full automation of an intended test at a low temperature, when the low-temperature test equipment of the present invention is configured so as to carry out the test in a continuos or successive manner.

While a preferred embodiment of the invention has been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A low-temperature test equipment comprising:

a vacuum chamber;

a prober including a probe card and probe needles and arranged in said vacuum chamber;

a specimen holder constructed to hold a specimen thereon and arranged in said vacuum chamber;

a refrigerator having a cooling head arranged in said vacuum chamber, to thereby cool the specimen through said specimen holder prior to a test of the specimen by means of said prober;

a plurality of photographing means arranged above said specimen holder in said vacuum chamber in such a manner that plane positions thereof are different from each other;

said photographing means being set at photographing magnifications different from each other, to thereby photograph the specimen;

a prism mechanism arranged between said photographing means and said specimen holder to permit said photographing means different in plane position from each other to photograph the photographed object;

wherein said prism mechanism is arranged so as to permit pickup of an image by each of said photographing means to be carried out through a hole of said probe card; and wherein said photographing means are set so as to permit one of said photographing means to photograph a distal end of said probe needles at a high magnification and a narrow visual field and the other photographing means to photograph a surface of the specimen at a low magnification and a wide visual field.

2. A low-temperature test equipment as defined in claim 1, wherein said plurality hing means are structured and arranged so as to be movable in three-dimensional directions.

3. A low-temperature test equipment as defined in claim 1, wherein each of said plurality of photographing means is constituted by a CCD camera.

4. A low-temperature test equipment as defined in claim 1, further comprising a spare chamber connected through an openable gate valve to said vacuum chamber so that evacuation of said spare chamber at a vacuum and opening of said spare chamber to an atmosphere is selectively carried out;

said spare chamber being constructed so as to receive a plurality of specimens therein and to feed the specimens received therein to said specimen holder while constantly keeping said vacuum chamber at a vacuum, resulting in the specimen being tested successively.

5. A low-temperature test equipment as defined in claim 1, wherein said specimen is a semiconductor wafer and said specimen holder is a wafer holder, whereby a semiconductor wafer supported on said wafer holder is subjected to a test.

* * * * *